United States Patent [19]

Anthony

[11] Patent Number: 4,728,878
[45] Date of Patent: Mar. 1, 1988

[54] SOLAR ENERGY ELECTRIC GENERATING SYSTEM

[76] Inventor: John Anthony, P.O. Box 13, Croton, N.Y. 10520

[21] Appl. No.: 65,161

[22] Filed: Jun. 19, 1987

Related U.S. Application Data

[63] Continuation-in-part of Ser. No. 860,904, May 8, 1986, abandoned.

[51] Int. Cl.[4] .............................................. H02N 6/00
[52] U.S. Cl. .................................... 322/2 R; 136/292; 136/293; 136/243; 136/246; 323/906; 363/79; 363/123
[58] Field of Search ................ 136/243, 246, 291–293; 323/234, 299, 906; 363/63, 78–79, 109, 123; 322/2 R

[56] References Cited

U.S. PATENT DOCUMENTS 1,640,393  8/1927  Coblentz .............................. 250/236
4,075,034  2/1978  Butler .................................. 136/246
4,577,052  3/1986  Schutten et al. ..................... 136/246

FOREIGN PATENT DOCUMENTS 53-144287  12/1978  Japan ................................... 136/293
58-131777  8/1983   Japan ................................... 136/293

Primary Examiner—Aaron Weisstuch
Attorney, Agent, or Firm—David Pressman

[57] ABSTRACT

A solar energy electric generating system for space vehicles is provided which directly generates alternating current from ambient light without the use of inefficient power conversion. Light incident to photocell arrays is mechanically or electrically gated to produce fluctuating DC. A number of transforming devices are provided to convert the fluctuating direct current to alternating current. By varying the frequency and duty cycle of the pulsing output voltage, frequency and phase relative to some reference may be controlled. Additionally, direct current may also be produced efficiently from the same photocell arrays. A closed-loop system is provided for regulation. The rotational torque produced by a rotating shutter version may also be used, under inertial navigation control, to provide a rotational torque for vehicle positioning.

32 Claims, 23 Drawing Figures

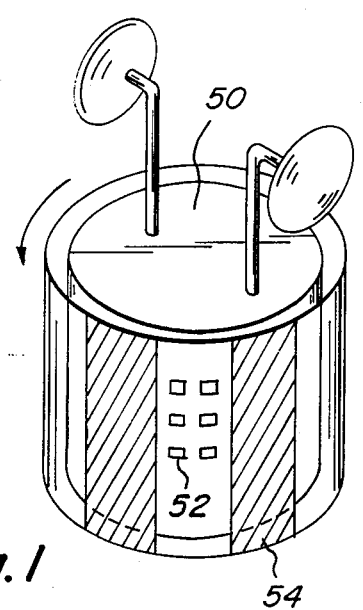
Fig. 1
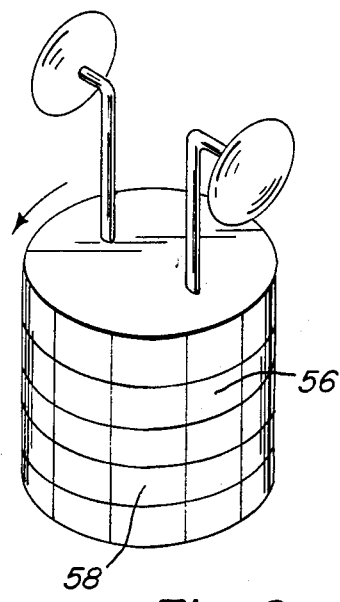
Fig. 2
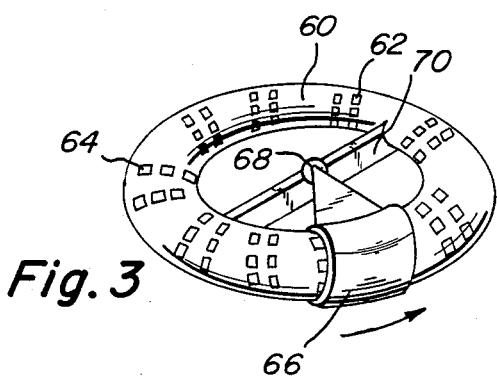
Fig. 3
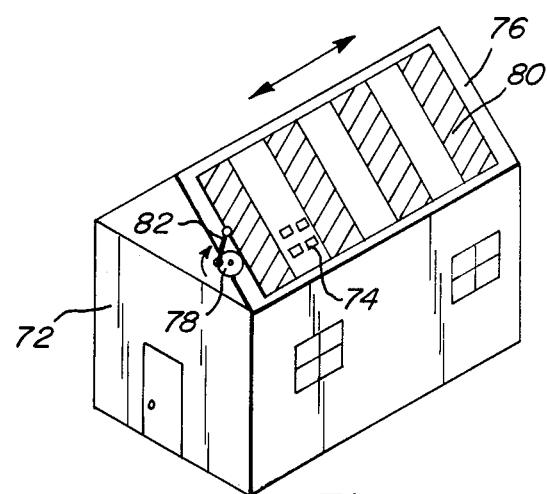
Fig. 4
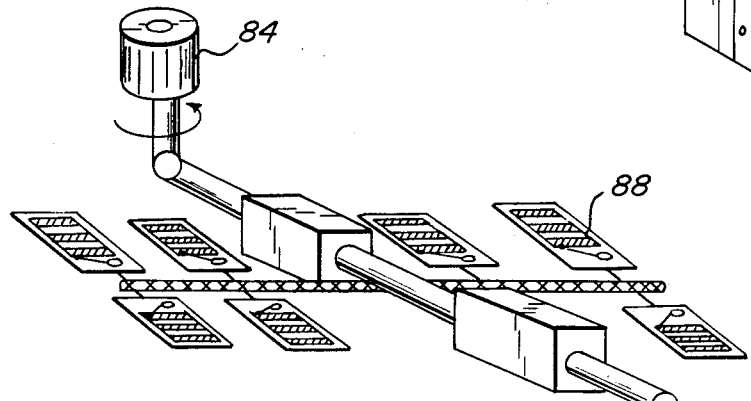
Fig. 3a
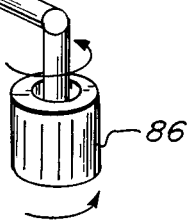

SOLAR ENERGY ELECTRIC GENERATING SYSTEM

This application is a continuation-in-part of application Ser. No. 860,904, filed May 8, 1986, now abandoned.

BACKGROUND—FIELD OF THE INVENTION

The present invention relates generally to the field of electric power generation, specifically to the generation of alternating current power aboard space vehicles, although many terrestrial situations are conceivable and also practical.

BACKGROUND—DESCRIPTION OF PRIOR ART

There are many well-known advantages to generating alternating current electrical power in space. One important advantage is the ability to transform the voltage over a wide range without the need for expensive and bulky power converters. The primary source of power aboard a space vehicle is solar energy from photoelectric cells mounted on the outer surface of the spacecraft. Unfortunately, photoelectric cells generate direct current only, and, up to now, have not been able to efficiently generate an alternating current.

A number of inventions have been posited which relate to generating electric power efficiently. A. Marks' (U.S. Pat. No. 4,445,050) "Device for Conversion of Light Power to Electric Power" employs a series of dipole antennas in an attempt to directly convert light to electrical energy, an extremely inefficient process compared to photoemissive techniques. J. Mockovciak's (U.S. Pat. No. 4,475,031) "Solar-Powered Sun Sensitive Window" and C. Hilsum et. al.'s (U.S. Pat. No. 3,944,817) "Optical Intensity Adjustment Devices" provide a way of varying the transmissivity of a window but does not address the issue of power generation. W. Todorof's (U.S. Pat. No. 4,479,027) "Multilayer Thin-Film, Flexible Silicon Alloy Photovoltaic Cell" and S. Chitre's (U.S. Pat. No. 4,081,820) "Complementary Photovoltaic Cell" do not produce alternating current. J. Rajagopal's (U.S. Pat. No. 4,083,356) "Solar Energy Apparatus" regulates heat energy generated in a fluid but does not generate an electric current. R. Corbefin's (U.S. Pat. No. 4,390,940) "Process and System for Producing Photovoltaic Power" and R. Steigerwald's (U.S. Pat. No. 4,404,472) "Maximum Power Control for a Solar Array Connected to a Load", and J. Evan's (U.S. Pat. No. 4,217,633) "Solar Cell System Having Alternating Current Output" generate alternating current using a DC-AC power converter, and do not directly generate an alternating current. J. Fitch et. al.'s (U.S. Pat. No. 4,408,206) "System for Transmitting Power From a Solar Satellite to Earth and Subsequent Conversion to a 60 Hertz Three Phase Signal" captures microwave instead of optical energy and is not used to generate usable low-frequency energy. J. Benjamin et. al.'s (U.S. Pat. No. 4,533,783) "AC Solar Cell" with Alternately Generated PN Junctions produces an alternating current but is an open-loop system with no provision for voltage, frequency, or phase control.

OBJECTS AND ADVANTAGES

It is, therefore, a primary object of the present invention to provide a solar energy electric generating system which directly generates an alternating current when an array of photocells are illuminated.

Further objects are to provide a solar energy electric generating system which does not require a DC-to-AC converter for power generation;

to provide a solar energy electric generating system which is adaptable to extra terrestrial satellites and space stations of any shape, whether cylindrical, toroidal, or rectilinear;

to provide a solar energy electric generating system which can use mechanical or electrical methods to gate the energy incident upon the photocells;

to provide a solar energy electric generating system which can generate three-phase alternating current in both delta and wye configurations;

to provide a solar energy electric generating system which is voltage, frequency, and phase regulated; and to provide a solar energy electric generating system whose torque output can be used for navigational control purposes as well as for the generation of electrical power.

Further objects of the invention will appear as the description proceeds.

DRAWINGS

FIG. 1 is a perspective diagrammatic view of a space satellite illustrating a rotational shutter for gating the light energy.

FIG. 2 is a modification of the invention showing a perspective diagrammatic view similar to FIG. 1, of a satellite which does not require any rotating shutter.

FIG. 3 is a perspective diagrammatic view of a toroidal shaped space station or satellite which uses a rotational component for gating the light energy.

FIG. 3a is a perspective diagrammatic view of a space station or satellite fixed in space which utilizes reciprocating components and rotating components to gate the light energy.

FIG. 4 is a perspective view of a typical terrestrial structure which utilizes an illustrative mechanical reciprocating component to gate the light energy, although it is understood that there are a multitude of methods to gate the light energy.

FIGS.—BASIC SYSTEM

Figure 5:
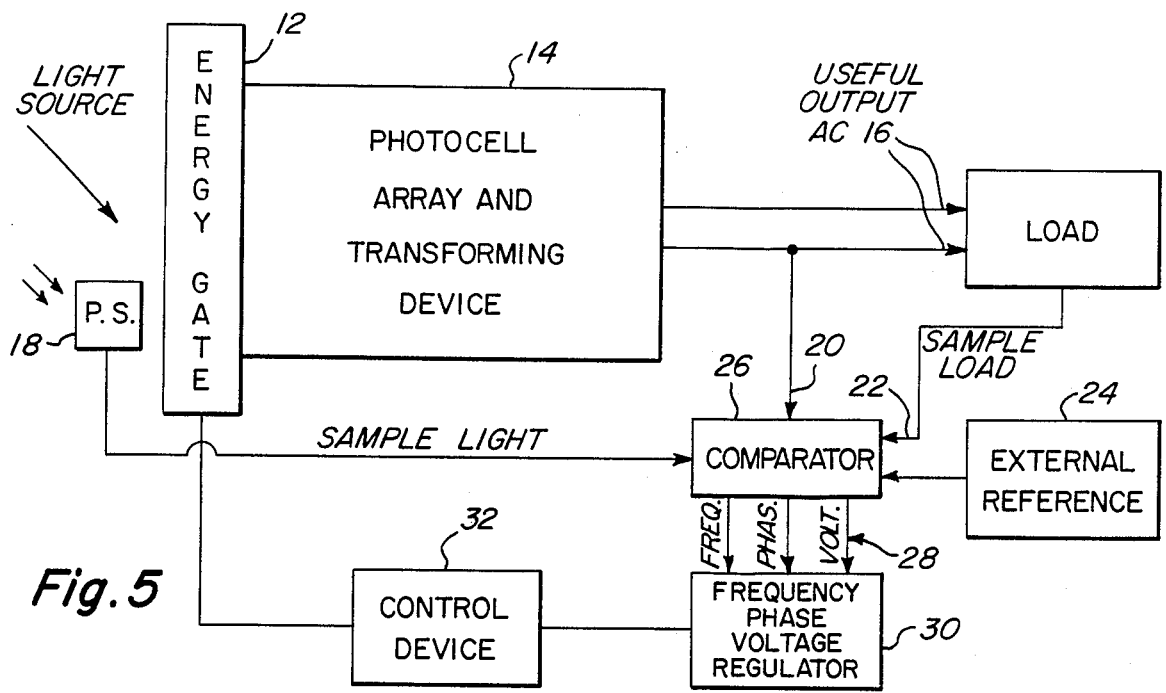
FIG. 5 is a block diagram illustrating the broad scheme of the invention.

The basic operation of the power generating system may best be understood with reference to FIG. 5. Light energy must pass through an energy gate 12 before reaching photocell array and transforming device 14. The output of the photocell array is a direct current so that the light input to the photocell array, when pulsed, will produced a fluctuating or gated direct current.

The transforming device will change the unipolar fluctuating direct current into an alternating current whose output is at 16. The peak output voltage will be proportional to the illumination reaching the photocell array. It is possible to vary the output voltage by varying the ratio of gate-on to gate-off, or duty cycle, of the energy gate 12. It is possible to vary the frequency of the alternating current output at 16 by varying the gating rate of energy gate 12. It is possible to lock the phase of the output at 16 to some other matched frequency source by locking the phase of the energy gate 12 to that source. By comparing the ambient light detected by photosensitive sampler 18, the output voltage sampled at 20, and the output load sampled at 22, to an external reference 24, comparator 26 can output frequency, phase, and voltage correction signals at 28 to frequency, phase, and voltage regulator 30 whose output drives a control device 32 which controls energy gate 12, thus forming a closed-loop control system.

FIG. 6—SERIES-PASS ELEMENT

Figure 6:
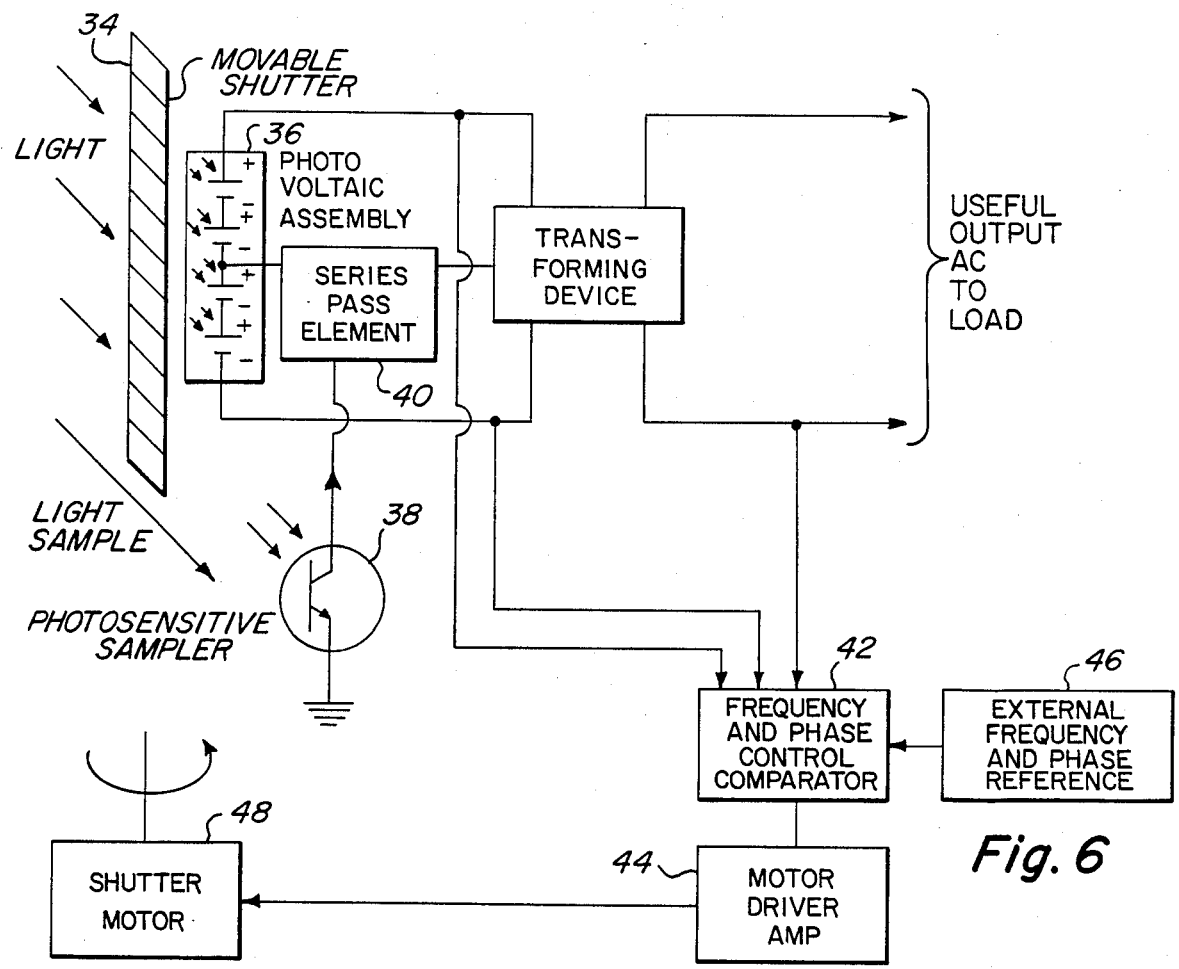
FIG. 6 is a block diagram illustrating a typical way of specifically constructing the invention.

FIG. 6 is similar to FIG. 5 but includes additional detail on one implementation of the design. In FIG. 6 the gating is performed by a reciprocating shutter 34 which gates light to photocell array 36, a full-wave array. Voltage control is provided via negative feedback from photosensitive sampler 38 which samples ambient light and outputs a corresponding signal to series pass element 40. As the ambient light decreases, the system compensates by allowing series pass element 40 to conduct more current. Frequency and phase control are accomplished by using frequency and phase control comparator 42 to output a correction signal to motor drive amp 44 based on any discrepancy between the sampled values and external frequency and phase reference 46. Motor drive amp 44 varies the frequency, phase, and duty cycle of reciprocating shutter 34, which is driven by shutter motor 48, forming a closed-loop system.

FIGS. 1 TO 4—GATING ARRANGEMENTS

The techniques for mechanically gating the photocell array are best unerstood with reference to FIGS. 1, 2, 3, 3a, and 4. In FIG. 1 a cylindrical satellite 50 is illustrated with photocell array 52. A cylindrical shutter 54 rotates clockwise coaxially to satellite 50, thereby gating light energy to the array 52.

In FIG. 2, photocell arrays, typified by 56 and 58, are gated by the clockwise rotation of the satellite itself.

In FIG. 3, a toroidal space station 60 is illustrated with photocell arrays typified by 62 and 64. Cylindrical sleeve 66 revolves clockwise pivoted at 68 on cross arm 70.

In FIG. 4, a typical terrestrial structure 72 is illustrated with photocell array 74 mounted upon its roof 76. Rotation of eccentric 78 causes reciprocating shutter 80 to oscillate via connecting arm 82 gating array 74.

In FIG. 3a, two cylindrical shutters 84 and 86, similar to 54 in FIG. 1, are combined with eight reciprocating shutters, typified by 88, similar to 80 in FIG. 4.

Figures 12, 13, 14:
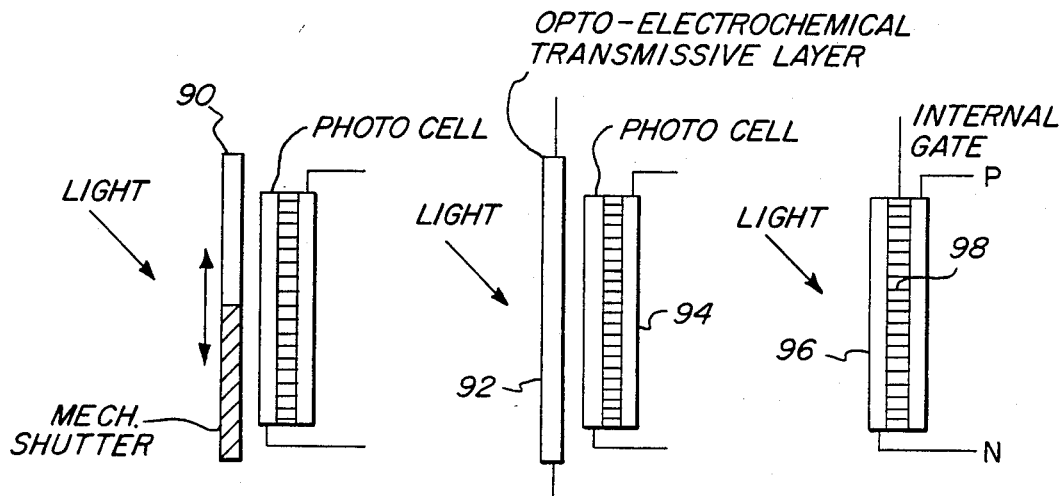
FIG. 12 through 14 illustrate typical structural mechanisms for gating light energy into the invention per se.

Beside using a mechanical shutter, like 90 in FIG. 12, it is also possible to use an optoelectrical shutter like 92 in FIG. 13, placed between the light source and photocell 94. Alternatively, the P/N junction of a photocell such as 96 in FIG. 14 can be directly gated by internal gate 98.

FIG. 7—PULSED DC TO AC CONVERTER

Figures 7, 8, 9:
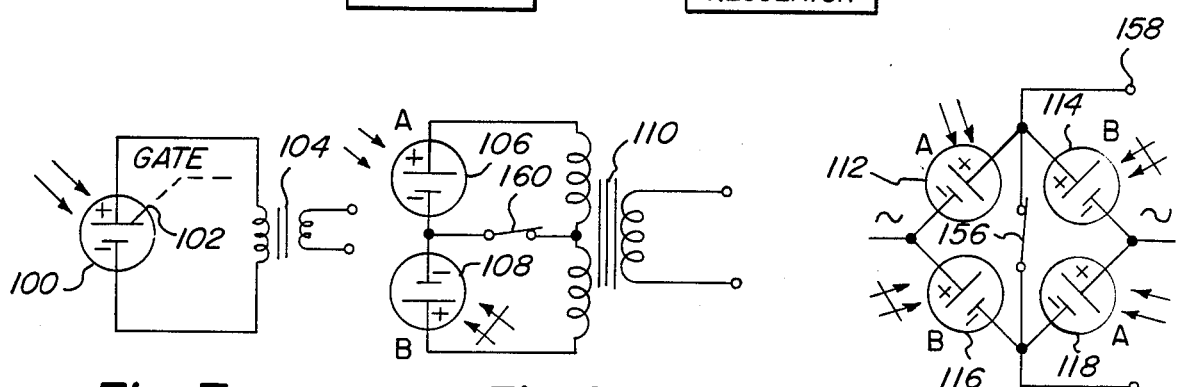
FIG. 7 through 11 illustrate typical circuit configurations which can be used for constructing the solar cell component of the invention.

A number of photocell array/transforming device combinations are possible and are illustrated in FIGS. 7 to 11. In FIG. 7 internally gatable photocell 100 is gated by an electrical signal at 102. The fluctuating DC output of photocell 100 is transformed to AC by transformer 104.

FIG. 7A—AC-PRODUCING PHOTOCELLS

Figure 7A:
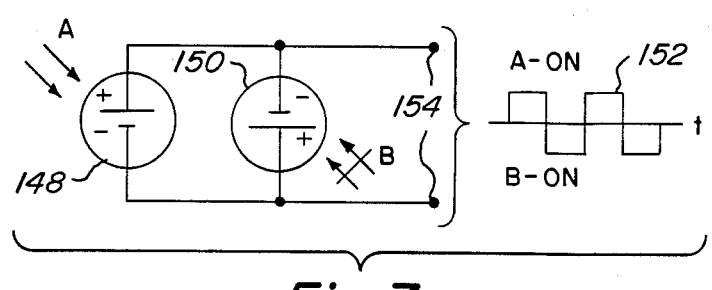

The transforming device for changing unipolar fluctuating direct current into alternating current need not be a physical transformer or even a separate discrete component. The transforming can be accomplished by the circuit geometry and the proper gate timing of photocell arrays as may be seen in FIGS. 7a, 9, 10, and 11. In FIG. 7a two photocells 148, and 150 are connected in parallel with their polarities reversed. Light energy-A is incidented upon photocell 148, while there is an absence of light energy-B incident upon photocell 150. With the proper gating of the light energy alternating between A and B, but with both never present at the same time, a square wave alternating current 152 is produced at the output 154. This transforming action is possible with a multiphase system (to numerous to illustrate) as well as with a three phase system illustrated in FIGS. 10, and 11.

FIG. 8—TWO CELLS WITH CT TRANSFORMER

In FIG. 8 two photocells 106 and 108 are connected to the center-tapped primary of transformer 110. Note that light is only incident upon photocell 106; photocell 108 is not illuminated. It is assumed that a non-illuminated photocell represents such a high resistance that, for all intents and purposes it has no effect. As light shifts between the photocells, an alternating current is established across the secondary winding of transformer 110. If a switch 160 or other gate mechanism is opened, the entire configuration's capability to produce alternating current is rendered inoperative and thus the system can be shut off regardless of the incident light input.

FIG. 9—FULL-WAVE PHOTOCELLS

This concept can be carried a step further, as in FIG. 9, where the transformer is eliminated entirely by using a bridge arrangement with photocells 112, 114, 116 and 118. Note that when 112 and 118 are illuminated 114 and 116 are not, and vice versa.

The configuration of the full wave bridge arrangement of FIG. 9 has two extra features present which are not immediately obvious. If a switch 156 or other gate mechanism is opened, the entire configuration's capability to produce alternating current is rendered inoperative and thus the system can be shut off regardless of the incident light input. In addition, the same configuration can supply direct current at the output terminal pair 158 if light is incidented on both A and B pairs of photocells at the same time, which, depending upon the gating mechanism, is quite easily implemented in some cases.

Thus using the bridge allows a satellite electrical system designer to fulfill the requirement of producing both AC or DC power efficiently from large arrays of photocells directly without any need for any transformer which contains iron and thus is heavy. Although the illustrations 7 through 11 show only single photocell symbols, that in fact this may represent many photocells connected in both parallel and series with cooperative gating systems coordinated by an appropriate control system.

Figure 10:
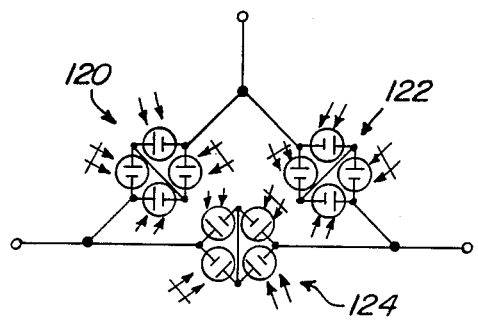
Figure 11:
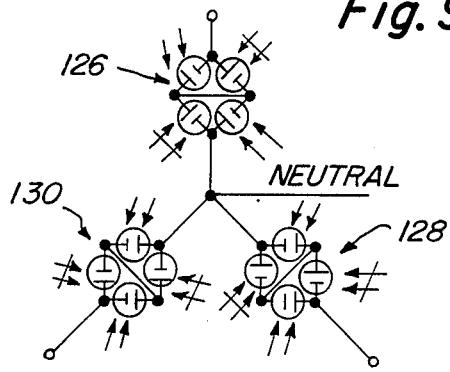

FIGS. 10 and 11—THREE-PHASE AC AND WYE CIRCUIT

Three phase AC can also be generated. In FIG. 10 photocell bridges 120, 122, and 124 are each connected on one leg of a conventional delta circuit. In FIG. 11 photocell bridges 126, 128, and 130 are each connected on one branch of a conventional wye circuit. By illuminating the appropriate photocells and carefully phasing their placement at 120°, three phase AC may be generated.

FIG. 15—GYROSCOPE

Figure 15:
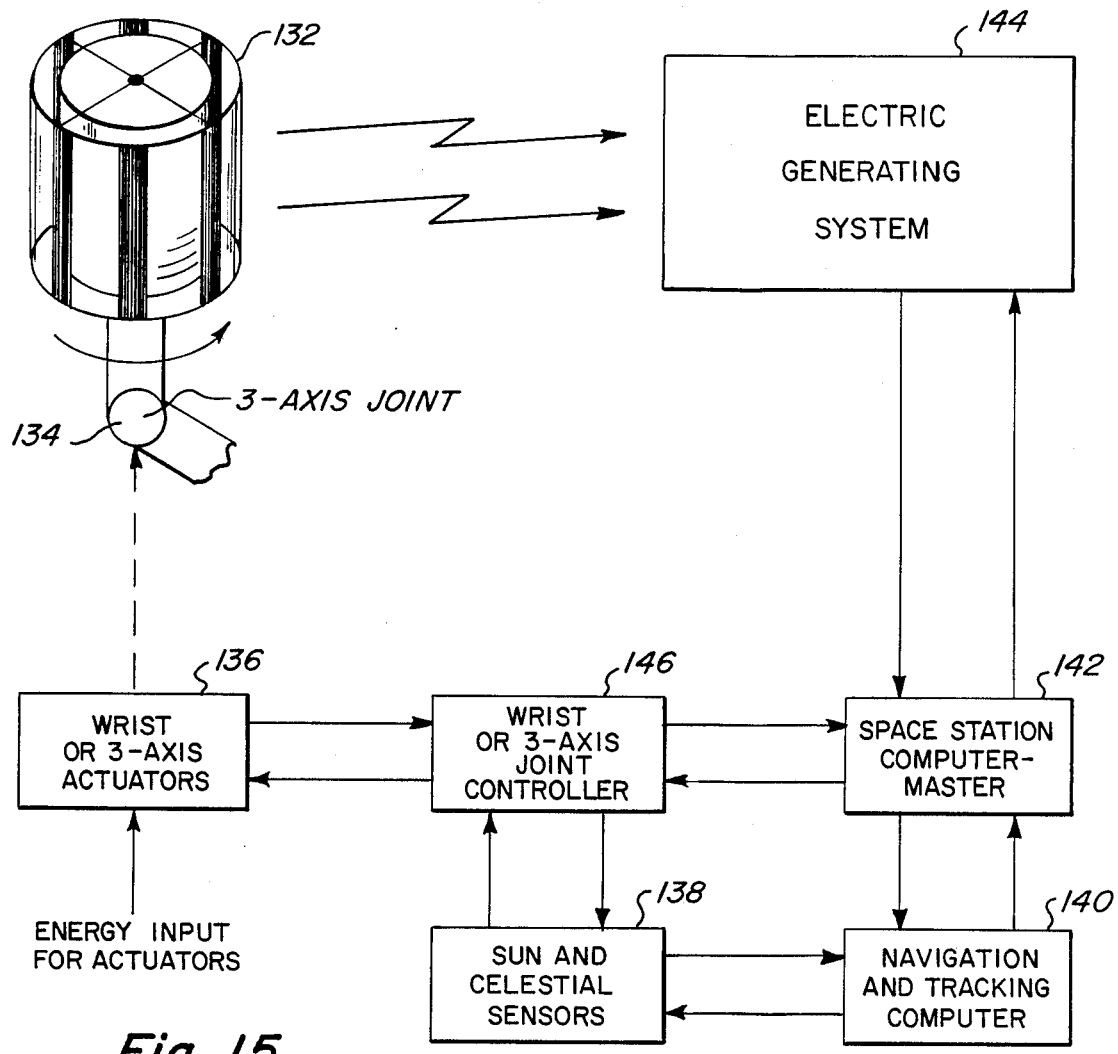
FIG. 15 is a block diagram illustrating how some modifications of the instant invention can be used not only for gating the light energy but in addition to develop torques for rotatively positioning a space station.

The electrical generating system may also serve a dual role in providing torque for space craft positioning as shown in FIG. 15. Rotating shutter 132 will provide a gyroscopic inertial torque in such direction as to oppose any change in its orientation. By indeed changing its orientation via a 3-axis joint 134 and 3-axis actuators 136, the induced torque may be used to rotate the space vehicle. Sun and celestial sensors 138 provide navigational position information to navigation and tracking computer 140 which reports positional correction information to space station computer-master 142.

This master computer must mediate between making navigational corrections and the need for optimal positioning of the electrical generating system 144 and, having done so, directs 3-axis joint controller 146 to reposition joint 134. Either 3-axis or wrist-type joints could be used.

FIG. 16—VARIABLE DENSITY ROTATING SHUTTER

As stated above, incident light may be interrupted, or gated onto a photovoltaic (PV) cell, or cells, by means of a mechanical shutter. This may be done with a single PV cell, inverted PV cells, or a configuration of bipolar PV cells. These configurations may be suitably increased in size, with series and parallel electrical connections, thus increasing the power available from the array; such expansion is common PV industry practice. The inverted and bipolar configurations are generally preferred since each cell, when suitably gated by any of the means described herein, may produce an approximation to both a square or a full sinusoidal output current and may, by suitable connection and transformation, produce a conventional alternating current ready for delivery as useful electrical energy into a load, including a domestic electric grid.

This gating of light has only been described thus far by means of a solid mechanical shutter (or shutters), whereby relative movement of the shutter(s) across the incident light path interrupts the light energy and thus modulates the energy output of the PV cell(s).

Figure 16:
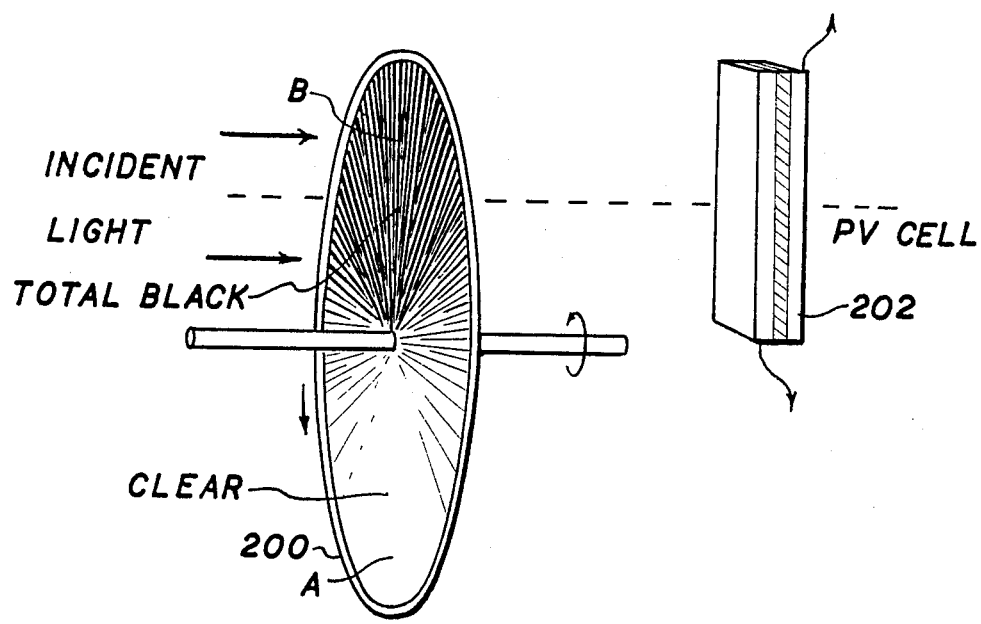
FIG. 16 is a perspective view of a variable density rotating shutter.

An additional form of the mechanical shutter may be in the form of a graded or variable density filter flat disc shutter 200, as shown in FIG. 16. Shutter 200 is normal to the path of incident light and has a transmission index which varies gradually, similar to that of a sinusoidal wave, from transparent (transmission index of 1) at area A, to totally opaque (transmission index 0) at area B. The transmission index of shutter 200 is uniform along any given radius. Shutter 200 may be fabricated of film which has been exposed in a variable manner in a circumferential direction, or which contains radial lines (not shown) of increasing density from A to B.

When shutter 200 rotates at a frequency f (angular velocity $2 \times Pi \times f$), it will cause incident light to impinge on PC cell 202 with a half-sinusoidal varying intensity. Thus the electrical output of cell 202 will be a half-sinusoidal output current waveform of frequency f. E.g., to generate a half-sinusoid of frequency f=60 Hz (cycles per second), shutter 200 should rotate at a rate of 60 rps. For synchronous electrical power generation, a control servo system (not shown) is provided to maintain a proper harmonic and phase relationship between the shutter and the alternating current system into which generated power is delivered, as discussed in connection with FIG. 5, supra.

Such a waveform is far more preferable than a square waveform which is produced by the non-variable gradient (black and white) shutter of FIG. 1. This is because the more a PV cell's output current approximates a sinusoidal waveshape, the more efficiently electrical transformation will be achieved.

In the case of back-to-back and bipolar PV cells (not shown), the output waveform will approximate a full sinusoid and thus this arrangement is preferable to a single PV cell.

As indicated, the transmission index is not confined to a sinusoid, but may be arranged to yield any other desired waveshape, such as sawtooth.

Further, the shutter may also contain a further filter that prevents passage of infra-red (long wavelength) light (heat energy), and may also contain enhancing materials to promote the transmission of ultra-violet (short wavelength) light, thus improving the efficiency and durability of the system.

FIG. 17—VARIABLE DENSITY LINEAR SHUTTER

Figure 17:
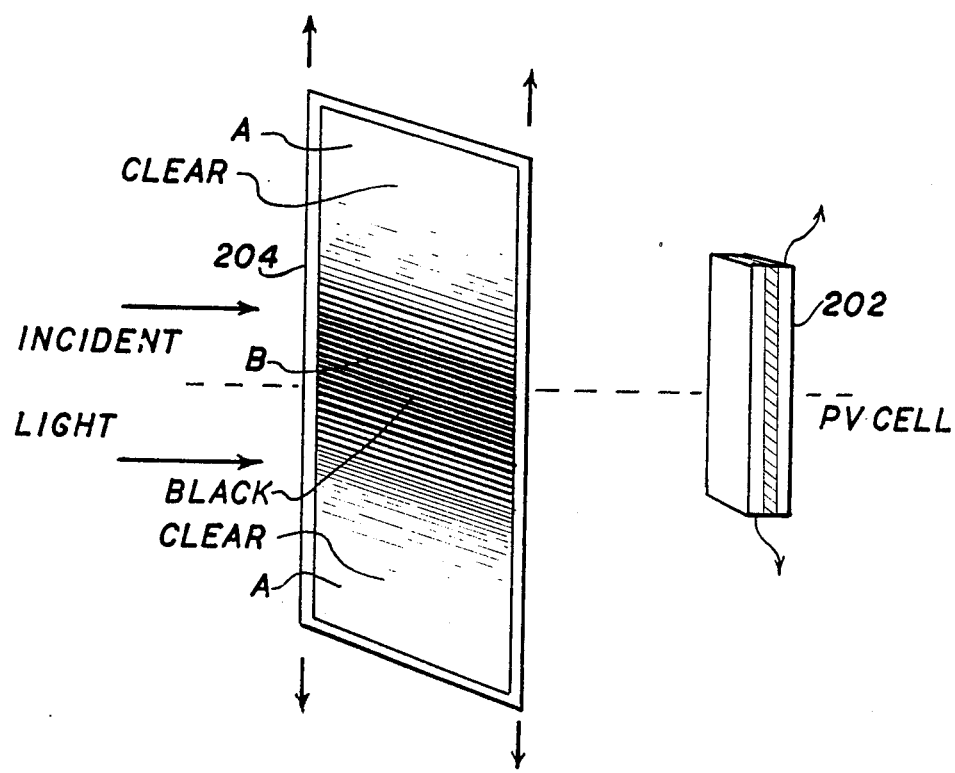
FIG. 17 is a perspective view of a variable density linear shutter.

FIG. 17 shows a linear, reciprocating shutter 204. It comprises a rectangular member which has a variable density gradient, varying from clear at areas A at the upper and lower ends to opaque at area B in its center.

When shutter 204 is moved in a reciprocating manner, as indicated, it will cause incident light to impinge upon PV cell 202 in a varying manner, similar to that of FIG. 16. This will cause the output of cell 202 to be a half-sinusoid.

Shutter 204 may be extended to form a complete annulus (not shown). In this case the annulus may be rotated in a single direction; this will cause cell 202 to produce the same output.

FIG. 18—VARIABLE DENSITY SHUTTERS WITH INCREASED NUMBER OF LIGHT/DARK AREAS

Figure 18:
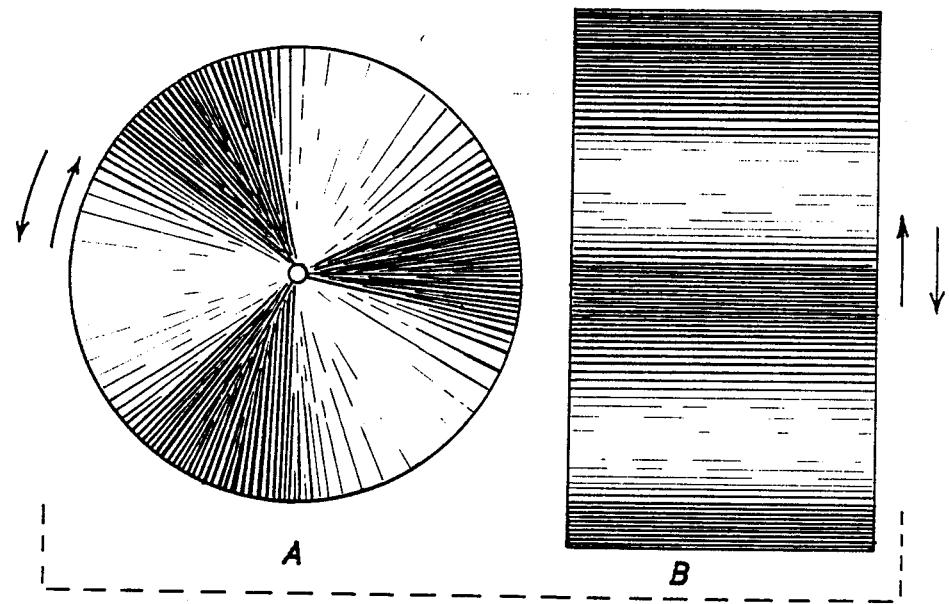
FIG. 18 is a perspective view of variable density rotating and linear shutters with a greater number of dark/light areas.

By increasing the number of light and dark areas (cycles) on the shutter, the output frequency of the PV cell will be increased. FIG. 18A shows a circular disc shutter with three cycles of light and dark areas, while FIG. 18B shows a three-cycle linear shutter. Obviously a greater or lesser number of cycles than three can be used, depending on the size of the shutter, the desired output frequency, the available motor speed, etc.

FIG. 19—MECHANICAL POLARIZING FILTERS

Figure 19:
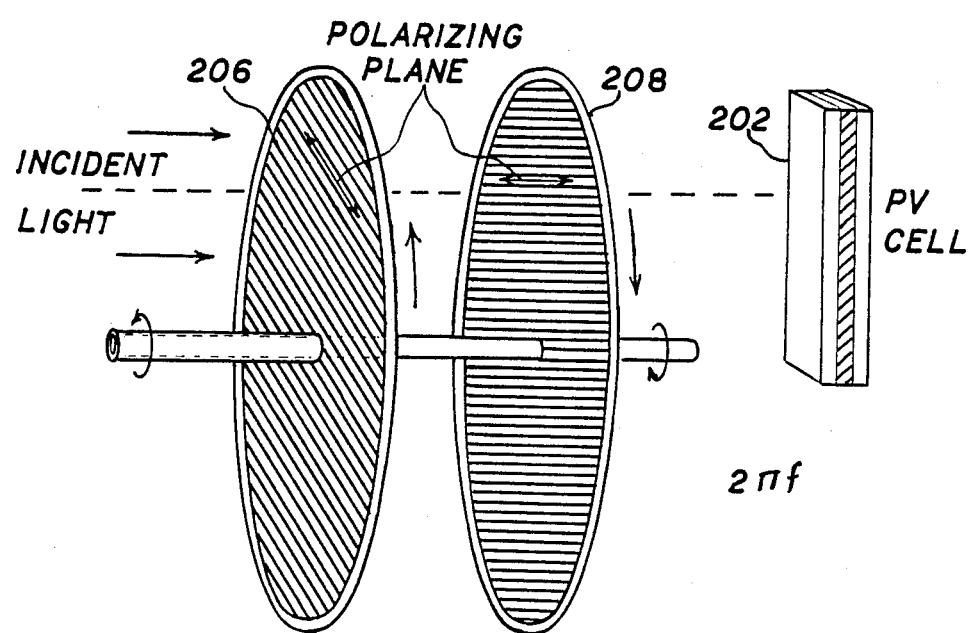
FIG. 19 is a perspective view of a plurality of rotating polarizing filter shutters.

In FIG. 19, incident light is gated onto the PV cell by a rotating shutter assembly comprising two identical shutters 206 and 208, each comprising a light-polarizing filter element. For optimum efficiency, the polarizing elements are non-chromatic, and each element has a high dynamic range of maximum to minimum light transmission when plane polarized light, incident upon a shutter, is rotated through 90 degrees.

In the preferred case, this range of light transmission is considered in the complete shutter assembly to go from maximum to minimum when one shutter is rotated through an angle of 90 degrees in respect to the other. I.e., if front shutter 206 is fixed and has a vertical polarizing plane as indicated by the lines of polarization, and back shutter 208 has a horizontal polarization as also indicated and is rotated, then the incident light will be sinusoidally varied as it impinges upon cell 202. However, I intend that in this embodiment both shutters move in opposite directions, as indicated. If the speed of each is $2 \times Pi \times f$, and they are rotated in opposite directions as indicated, then cell 202 will produce a half-sinusoid of output current of frequency f.

Other polarizer angles and gradations may be used, although I prefer that the combined light gating be such as to yield a half-sinusoidal output current from the PV cell.

Both IR filtering and UV enhancement may be included in the shutter assembly, as described in connection with FIG. 16.

In addition to the relative rotational motion between the two shutters, many alternative rotational and linear motion methods can be easily envisioned.

A special case of this method will occur when the light source is plane-polarized light (rather than solar light energy which generally exhibits little polarization). In this case only one polarized shutter will be required to effect gating action.

FIG. 20—FIXED AND STATIONARY SHUTTERS

Figure 20:
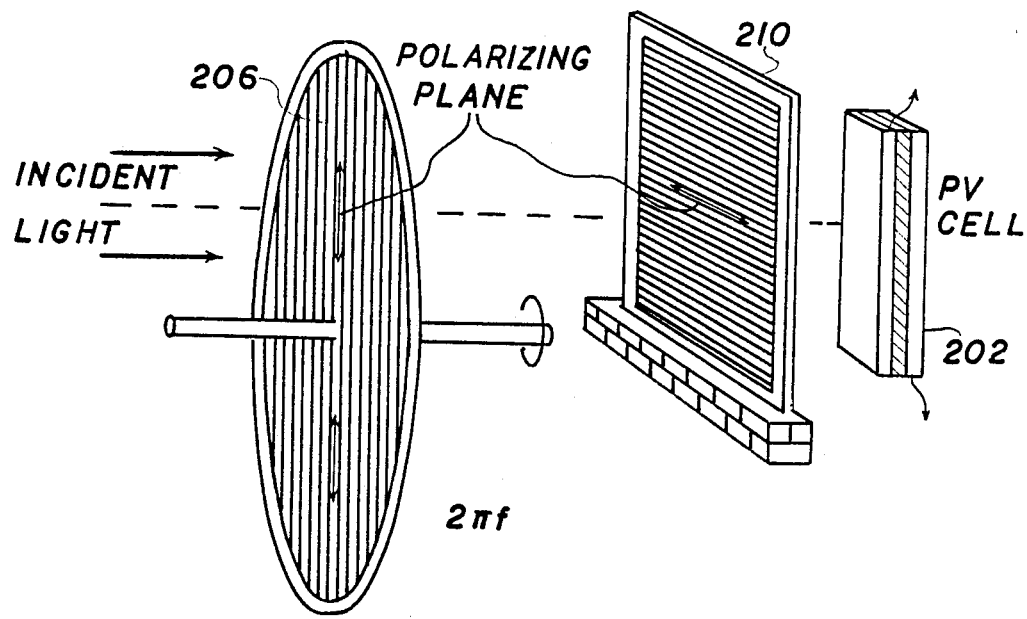
FIG. 20 is a perspective view of a rotating polarizing filter shutter in conjunction with a stationary shutter.

In addition to the case where the two shutters move in opposite directions, as shown in FIG. 19, one shutter can be fixed and the other shutter can rotate, as indicated in FIG. 20. I.e., front shutter 206 is circular and identical to that of FIG. 19. A fixed rear shutter 210 can be made with a square shape since it does not have to rotate. The planes of polarization of the two shutters are as indicated. When front shutter 206 rotates at a speed of $2 \times Pi \times f$, cell 202 will produce an output current (half-sinusoid) of frequency f.

FIG. 21—MULTI-SECTION POLARIZING SHUTTERS

Figure 21:
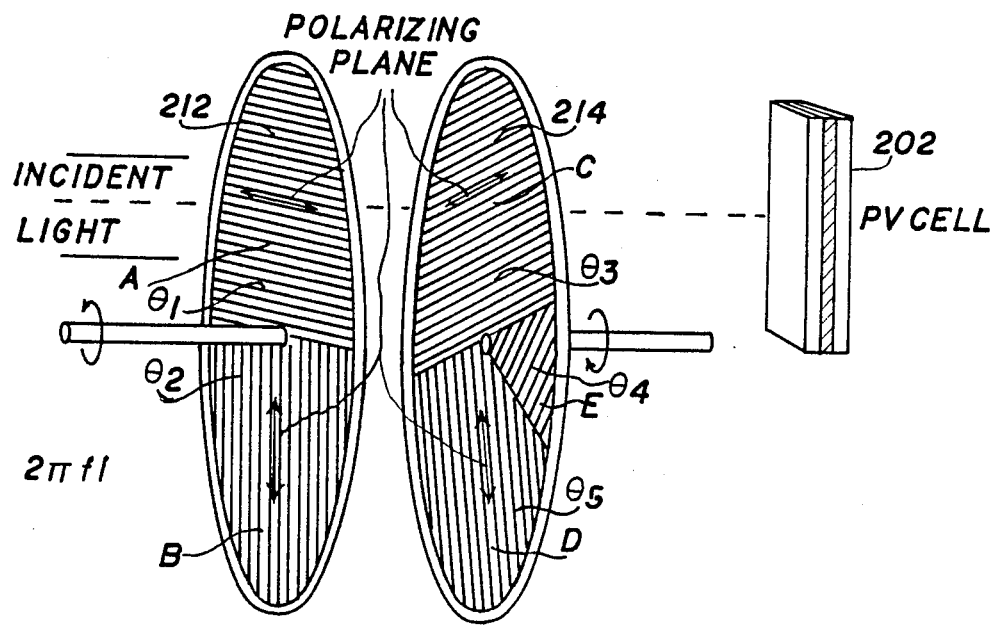
FIG. 21 is a perspective view of a plurality of rotating polarizing filter shutters with different velocities and multiple polarizing sections within the shutters.

Further ramifications are possible. By varying the relative angular shaft velocites and by providing sections of polarizing material at different angles on the shutters themselves, complex current output waveshapes and amplitudes may be derived from the PV cell. As shown in FIG. 21, a front shutter 212 has two sections, A and B, each of which is a semicircle of half the area of the shutter, two two semicircles being separated by a straight diametrical line. The angle which includes section A is $\theta 1$, which is 180°, as is the angle, $\theta 2$, which includes section B. These two sections have perpendicular polarizations, as indicated. A rear shutter 214 has three differently-polarized sections, C, D, and E. Section C is a semicircle, subtended by angle $\theta 3$ of 180° and has a polarization parallel to the sides of angle $\theta 3$. Section D is a small sector which is subtended by angle $\theta 4$ of 30° with a polarization perpendicular to the bisector (not shown) of angle $\theta 4$. Section E is a large sector subtended by an angle $\theta 5$ of 60°; its polarization is at an angle to that of the other two polarizations of shutter 214.

By suitable adjustment of polarizing section angles and relative shutter speeds, the output frequency and waveshape may be selected as desired. However a half-sinusoidal output is preferred for purposes of practical electrical AC power generation.

CONCLUSION

Thus the reader will see that I have disclosed various forms of photovoltaic cell generating systems which can provide an alternating current output, either through the use of various light interrupting or varying means. These systems avoid the need for expensive, heavy, and awkward DC-to-AC converters, especially valuable advantages in satellite systems.

RAMIFICATIONS AND SCOPE

While certain novel features of this invention have been shown and described and are pointed out in the annexed claims, it will be understood that various omissions, substitutions and changes in the forms and the details of the device illustrated and in its operation can be made by those skilled in the art without departing from the spirit of the invention.

Thus the scope of the invention should be determined only by the appended claims and their legal equivalents.

What is claimed is:

1. A solar energy electric generating system, comprising in combination:
    (a) an array of photocells;
    (b) means for gating the electrical direct current energy produced by said array of photocells;
    (c) means for transforming the electrical direct current energy at an output of said array of photocells whereby an alternating current at the output of said transforming means is produced, and which is controlled by a control device for controlling the rate and duty cycle of said gating means; and
    (d) a photosensitive sampler which samples light incident upon said photocell array and outputs a proportional signal.

2. A solar energy electric generating system, as recited in claim 1, wherein said photocell array and said transforming means comprise internally gated photocells, connected to a pulsating direct current to alternating current converter.

3. A solar energy electric generating system, as recited in claim 2, wherein said pulsating direct current to alternating current converter is an electromagnetic transformer.

4. A solar energy electric generating system, as recited in claim 1, wherein said photocell array and said transforming device comprise an electromagnetic transformer with center-tapped primary winding, wherein one group of said photocells are connected from center-tap to one end of said winding, and another group of said photocells, with opposite polarity, are connected from said center-tap to the opposite end of said winding, wherein each of said groups of said photocells are physically arrayed such that the incidence of light on one said group is mutually exclusive of the other, thereby producing an alternating current at the output of said transformer as light is sequentially incident upon each of said group of photocells.

5. A solar energy electric generating system, as recited in claim 1, wherein said photocell array and said transforming device comprises two pairs of photocell arrays, each pair having opposite polarity, each pair being mutually exclusive with respect to incident light; wherein said pairs are connected in a bridge configuration with matching pairs on opposite legs of said bridge, with a shorting connection between the sets of opposite junction where arrays meet with matching polarities, with output taken off the opposite pair, such that as said pair are sequentially illuminated an alternating current is produced.

6. A solar energy electric generating system, as recited in claim 5, wherein a delta circuit is configured, wherein each leg of said delta contains one of said bridges, and said photocell arrays are arranged so as to produce energy from said bridges with 120° phase difference, thereby producing a 3-phase alternating current output.

7. A solar energy electric generating system, as recited in claim 5, wherein a wye circuit is configured, wherein each leg of said wye contains one of said bridges, and said photocell arrays are arranged so as to produce energy from said bridges with 120° phase difference, thereby producing a 3-phase alternating current output.

8. A solar energy electric generating system, comprising in combination:
 (a) an array of photocells;
 (b) means for gating the electrical direct current energy produced by said array of photocells;
 (c) means for transforming the electrical direct current energy at an output of said array of photocells whereby an alternating current at the output of said transforming means is produced, and which is controlled by a control device for controlling the rate and duty cycle of said gating means;
 (d) a photosensitive sampler which samples light incident upon said photocell array and outputs a proportional signal;
 (e) a comparator which compares said proportional signal, a sample of the output voltage, a sample of the output frequency, and a sample of the output current, to an external reference and outputs voltage, phase, and frequency correction signals; and,
 (f) a voltage, frequency and phase regulator which takes said voltage, phase, and frequency correction signals and causes said control device to gate said energy produced by said array of photocells, thereby forming a closed control loop system which outputs an alternating current power source of fixed voltage, frequency, and phase.

9. A solar energy electric generating system, comprising in combination:
 (a) an array of photocells;
 (b) means for gating the electrical direct current energy produced by said array of photocells, wherein said array of photocells comprises a cylinder upon whose outer surface are interspersed photocells, wherein said gating means comprises a rotating superimposed cylinder with apertures;
 (c) means for transforming the electrical direct current energy at an output of said array of photocells whereby an alternating current at the output of said transforming means is produced, and which is controlled by a control device for controlling the rate and duty cycle of said gating means;
 (d) a photosensitive sampler which samples light incident upon said photocell array and outputs a proportional signal; and
 (e) a three-axis joint, and three-axis actuators, and a 3-axis joint controller, whereby the axis of rotation of said rotating cylinder at a distal end of said three-axis joint may be varied so as to impart a controllable inertial torque to said system.

10. A solar energy electric generating system, as recited in claim 9, further comprising sun and celestial sensors, a navigation and tracking computer which inputs data from said sensors and outputs course correction data, and a space station computer-master which mediates between the navigational application of said inertial torque and the orientation of said rotating cylinder for the purpose of electrical power generation.

11. A solar energy electrical generating system, comprising in combination:
 (a) an array of photocells;
 (b) means for gating the electrical direct current energy produced by said array of photocells; and
 (c) means for transforming the electrical direct current energy at an output of said array of photocells whereby either an alternating current at a first output of said transforming means is produced or a direct current at a second output of said transforming means is produced.

12. A solar energy electric generating system, as recited in claim 11 further comprising a control device for controlling the rate and duty cycle of said gating means.

13. A solar energy electric generating system, as recited in claim 11 further comprising a photosensitive sampler which samples light incident upon said photocell array and outputs proportioonal signals at a either said first output or said second output.

14. A solar energy electric generating system, as recited in claim 11 further comprising in combination:
 (a) a photosensitive sampler which samples light incident upon said photocell array and outputs proportional signals;
 (b) a comparator which compares said proportional signal with said first output, a sample of the output voltage, a sample of the output frequency, and a sample of the output current, to an external reference and outputs voltage, phase, and frequency correction signals;
 (c) a voltage, frequency, and phase regulator which takes said voltage, phase, and frequency correction signals and causes said control device to gate said energy produced by said array of photocells, thereby forming a closed control loop system which outputs to said first outputs an alternating current power source of fixed voltage, frequency, and phase; and
 (d) a comparator which compares said proportional signal with said second output, a sample of the output voltage, to an external reference and outputs voltage correction signals, thereby forming a closec control loop system which outputs to said second output a direct current power source of fixed voltage.

15. A solar energy electric generating system, as recited in claim 11, wherein said array of photocells comprises a cylinder upon whose outer surface are interspersed photo cells, wherein said gating means comprises a rotating superimposed cylinder with apertures.

16. A solar energy electric generating system, as recited in claim 15, further comprising a three-axis joint, and three-axis actuators, and a 3-axis joint controller, whereby the axis of rotation of said rotating cylinder at the distal end of said three-axis joint may be varied so as to impart a controllable inertial torque to said system.

17. A solar energy electric generating system, as recited in claim 16, further comprising sun and celestial sensors, a navigation and tracking computer which inputs data from said sensors and outputs course correction data, and a space station computer-master which mediates between the navigational application of said inertial torque and the orientation of said rotating cylinder for the purpose of electrical power generation.

18. A solar energy electric generating system, as recited in claim 11, wherein said array of photocells comprises a cylinder upon whose outer surface are interspersed photo cells, wherein said gating means comprises rotating said cylinder.

19. A solar energy electric generating system, as recited in claim 11, wherein said array of photocells comprises a torus upon whose outer surface are interspersed photo cells, wherein said gating means comprises a curved cylindrical sleeve which is coaxial to said torus and moves in a circular arc thereby gating said solar cells.

20. A solar energy electric generating system, as recited in claim 11, wherein said array of photocells comprises a planar array, wherein said gating means comprises a planar reciprocating shutter.

21. A solar energy electric generating system, as recited in claim 11, wherein said array of photocells comprises a torus upon whose outer surface are interspersed photocells, wherein said gating means comprises a curved cylindrical sleeve which is coaxial to said torus and moves in a circular arc and also comprises a planar photocell array, wherein said gating means comprises a planar reciprocating shutter.

22. A solar energy electric generating system, as recited in claim 11, wherein said means for transforming is achieved by the circuit configuration of said array of photocell in combination with the proper on and off gating of photocells in said array.

23. A solar energy electric generating system, as recited in claim 11, wherein said photocell array and said transforming means comprise internally gated photocells, connected to a pulsating direct current to alternating current converter at the first output of said transforming means.

24. A solar energy electric generating system, as recited in claim 23, wherein said pulsating direct current to alternating current converter is an electromagnetic transformer.

25. A solar energy electric generating system, as recited in claim 11, wherein said photocell array and said transforming device comprise an electromagnetic transformer with center-tapped primary winding, wherein one group of said photocells are connected from center-tap to one end of said winding, and another group of said photocells, with opposite polarity, are connected from said center-tap to the opposite end of said winding, wherein each of said groups of said photocells are physically arrayed such that the incidence of light on one said group is mutually exclusive of the other, thereby producng an alternating current at the output of said transformer as light is sequentially incident upon each of said group of photocells.

26. A solar energy electric generating system, as recited in claim 11, wherein said gating means comprises an electrochemical transmissive layer placed between said photocell array and said light source.

27. A system for converting light energy to electrical energy, comprising:
a photovoltaic cell for converting incident light energy to direct electrical current,
variable shutter means for causing said light energy incident upon said photocell to vary periodically and repetitively from a relatively low value to a relatively high value and back to said relatively low value in a gradual manner.

28. The system of claim 27 wherein said variable shutter means comprises a membrane whose light transmissivity varies gradually from a relatively high light transmissivity to a relatively low light transmissivity, and means for causing said membrane to repetitively move in a cyclic manner in front of said photovoltaic cell.

29. The system of claim 27 wherein said variable shutter means comprises a circular membrane and means for rotating said membrane with respect to said photocell.

30. The system of claim 27 wherein said variable shutter means comprises a membrane and means for causing said membrane to reciprocate with respect to said photocell.

31. The system of claim 27 wherein said variable shutter means comprises a membrane with a plurality of sets of areas which vary from light to dark.

32. The system of claim 27 wherein said variable shutter means comprises a plurality of polarizing membranes and means for moving said membranes with respect to each other.

* * * * *